United States Patent
Carter et al.

[11] Patent Number: 5,998,876
[45] Date of Patent: Dec. 7, 1999

[54] REWORKABLE THERMOPLASTIC HYPER-BRANCHED ENCAPSULANT

[75] Inventors: Kenneth Raymond Carter, San Jose; Craig Jon Hawker, Los Gatos; James Lupton Hedrick, Pleasanton; Robert Dennis Miller, San Jose, all of Calif.; Michael Anthony Gaynes, Vestal; Stephen Leslie Buchwalter, Hopewell Junction, both of N.Y.

[73] Assignee: International Business Machines Corporation, Armonk, N.Y.

[21] Appl. No.: 09/000,501

[22] Filed: Dec. 30, 1997

[51] Int. Cl.$^6$ ..................................................... H01L 23/48
[52] U.S. Cl. ........................... 257/778; 257/787; 528/10; 526/238
[58] Field of Search .................................. 257/778, 779, 257/780, 787; 548/455; 528/10, 370, 401, 422; 526/238, 185, 217, 236, 263, 346, 333, 292.9, 279, 221

[56] References Cited

U.S. PATENT DOCUMENTS

| | | |
|---|---|---|
| 3,801,880 | 4/1974 | Harada et al. . |
| 3,864,426 | 2/1975 | Salensky . |
| 4,012,832 | 3/1977 | Crane . |
| 4,370,292 | 1/1983 | Yanase et al. . |
| 4,529,755 | 7/1985 | Nishikawa et al. . |
| 4,604,444 | 8/1986 | Donnadieu et al. . |
| 4,626,556 | 12/1986 | Nozue et al. . |
| 4,632,798 | 12/1986 | Eickman et al. . |
| 4,663,190 | 5/1987 | Fujita et al. . |
| 4,729,062 | 3/1988 | Anderson et al. . |
| 4,738,892 | 4/1988 | Canova . |
| 4,983,683 | 1/1991 | Shimp . |
| 4,985,751 | 1/1991 | Shiobara et al. . |
| 5,037,779 | 8/1991 | Whalley et al. . |
| 5,043,211 | 8/1991 | Yoshizumi et al. . |
| 5,061,657 | 10/1991 | Queen et al. . |
| 5,064,895 | 11/1991 | Köhler et al. . |
| 5,072,874 | 12/1991 | Bertram et al. . |
| 5,120,678 | 6/1992 | Moore et al. . |
| 5,128,204 | 7/1992 | Charmot . |
| 5,140,068 | 8/1992 | Siebert et al. . |
| 5,160,786 | 11/1992 | Nakai . |
| 5,199,163 | 4/1993 | Ehrenberg et al. . |
| 5,250,848 | 10/1993 | Christie et al. . |
| 5,264,520 | 11/1993 | Mullins et al. . |
| 5,274,913 | 1/1994 | Grebe et al. . |
| 5,286,572 | 2/1994 | Clodgo et al. . |
| 5,298,548 | 3/1994 | Shiobara et al. . |
| 5,300,625 | 4/1994 | Helmreich et al. . |

(List continued on next page.)

FOREIGN PATENT DOCUMENTS

| | | |
|---|---|---|
| 0 051 165 | 5/1982 | European Pat. Off. . |
| 0 169 066 | 1/1986 | European Pat. Off. . |
| 0 382 575 | 8/1990 | European Pat. Off. . |

OTHER PUBLICATIONS

Chan, K. P., "Cyclic Aryl Ethers: New Intermediates for High Performance Polymers", Department of Chemistry, McGill University, (Apr. 1995).

Frechet, J. M. J. et al., "Synthesis and Properties of Dendrimers and Hyperbranched Polymers", Cornell University and IBM Almaden Research Center, pp. 71–132.

(List continued on next page.)

*Primary Examiner*—Carl Whitehead, Jr.
*Attorney, Agent, or Firm*—Robert B. Martin; John J. Gresens

[57] ABSTRACT

The invention is an encapsulated circuit assembly including a chip; a substrate; at least one solder joint, wherein the solder joint spans between the chip and the substrate forming an electrically conductive connection between the chip and the substrate; and an encapsulant formed adjacent the solder joint, wherein the encapsulant comprises a hyperbranched polymer formed by the reaction of a monomer of the formula: $(A)_nRB$, wherein A is a coupling group reactive with B, B is a coupling group reactive with A, n is greater than 1, and R is a group selected from the group consisting of an aromatic group, an aliphatic group, and mixtures thereof.

13 Claims, 1 Drawing Sheet

U.S. PATENT DOCUMENTS

| | | |
|---|---|---|
| 5,313,365 | 5/1994 | Pennisi et al. . |
| 5,326,413 | 7/1994 | Esemplare et al. . |
| 5,371,328 | 12/1994 | Gutierrez et al. . |
| 5,381,304 | 1/1995 | Theroux et al. . |
| 5,434,751 | 7/1995 | Cole, Jr. et al. . |
| 5,457,149 | 10/1995 | Hall et al. . |
| 5,460,767 | 10/1995 | Sanftleben et al. . |
| 5,471,096 | 11/1995 | Papathomas et al. . |
| 5,474,620 | 12/1995 | Nath et al. . |
| 5,498,689 | 3/1996 | Furuta et al. . |
| 5,514,764 | 5/1996 | Frechet et al. ............................. 528/10 |
| 5,587,441 | 12/1996 | Frechet et al. ........................... 526/238 |
| 5,587,446 | 12/1996 | Frechet et al. ........................... 526/333 |
| 5,663,260 | 9/1997 | Frechet et al. ........................ 526/292.9 |
| 5,708,304 | 1/1998 | Tomita ..................................... 257/778 |
| 5,777,129 | 7/1998 | Juneau et al. ........................... 548/455 |

OTHER PUBLICATIONS

Srinivasan, S. et al., "Heterocycle–Activated Aromatic Nucleophilic Substitution of $AB_2$ Poly(aryl ether phenylquinoxaline) Monomers. 3", *Macromolecules*, 29(26):8543–8545 (1996).

Srinivasan, S. et al., "Poly(aryl ether phenylquinoxalines) via Anionic Ring Opening Polymerization of Macrocycles", *Macromol. Symp.*, 122, 101–109 (1997).

Tummala, R. et al., "Chip–To–Package Interconnections", *Microelectronics Packaging Handbook Part II, Second Edition*, pp. 132–184 (1997).

REWORKABLE THERMOPLASTIC HYPER-BRANCHED ENCAPSULANT

FIELD OF THE INVENTION

The invention relates generally to thermoplastic reworkable encapsulants for integrated circuit assemblies. More specifically, the invention relates to reworkable encapsulants for integrated circuits and modules which comprise highly functionalized hyper-branched polymers.

BACKGROUND OF THE INVENTION

Integrated circuit components are often encapsulated to maintain structural and functional integrity. In many instances, the encapsulant is a cured polymer composition. The attributes of curable resins include the combination of processability prior to curing with outstanding properties after curing. Curable resins generally have a low viscosity prior to curing, even in the absence of solvents. After curing, these polymer compositions exhibit toughness, adhesion, and solvent resistance.

The attributes of these polymer compositions also may include intractability after curing. This intractability is often the result of a curing reaction in a thermosetting resin to convert a low molecular weight precursor to a polymer network of essentially infinite molecular weight. These attributes make thermosetting resins ideal for use in the construction of circuit assemblies such as single-sided and double-sided circuits, as well as other types of surface mount technology including chip carriers, multichip modules and multilayer boards.

Exemplary compositions which have been disclosed as useful in encapsulating semiconductor devices include those taught by Eichman, et al., U.S. Pat. No. 4,632,798. Eichman discloses a molding composition comprising a melt processable thermotropic liquid crystal and polymer having a relatively low weight average molecular weight of about 4,000 to about 10,000 which is substantially incapable of further chain growth upon heating. Dispersed within the liquid crystal and polymer is approximately 40–80% by weight of a particular inorganic material (preferably silicon dioxide). Eichman et al. address problems with prior encapsulants including the need for refrigeration prior to use and the requirement for relatively long cycle and cure times during molding.

Christie, et al., U.S. Pat. No. 5,250,848, address the solder connections used for joining an integrated semiconductor device to a carrier substrate and particularly to a structure for forming solder interconnection joints that exhibit improved fatigue life and stability. The Christie, et al. encapsulate composition contains a binder selected such as a cyclo aliphatic polyepoxide, an inorganic filler, with a particle size less than 31 microns, and optionally a surfactant.

Papathomas, et al., U.S. Pat. No. 5,471,096, discloses a method of increasing the fatigue life of solder interconnections between a semiconductor device and a supporting substrate. The Papathomas composition contains about 40 to 70% by weight bisphenyl M dicyanate and preferably 30% by weight of the 4,4'-ethylidene bisphenol dicyanate, and an inorganic filler. The compositions can also include a catalyst to promote the polymerization of the cyanide ester mixture.

Kohler, et al., U.S. Pat. No. 5,064,895, also teaches molding compounds of polyarylene sulfide (PAS), preferably polyphenylene sulfides (PPS) which have a low iron content and delayed crystallization and to their use as an encapsulating compound for both active and passive electronic components.

Nakai, U.S. Pat. No. 5,160,786, discloses a resin material for inserting a lead frame of a polyarylene sulfide resin; an alpha olefin copolymer graft copolymerized with an unsaturated carboxylic acid or its anhydride; and a fibrous filler, a nonfibrous inorganic filler or a mixture thereof.

However, once cured, these encapsulants tend to form non-reworkable and intractable masses. The intractability of encapsulants has become more of a liability because of concerns about the longevity of circuit assemblies in the environments of use. Additionally, in many applications, the attachment of discrete devices, and their subsequent encapsulation, is a continuing process which often requires the application of high temperatures in the circuit assembly environment. These high temperatures can char and destroy a cured encapsulant. Also, many manufacturers are taking responsibility for disposal or recycling of their products. Manufacturers may even be required to be responsible for disposal or recycling of products through government regulation, even after disposal.

Intractable compositions are also not compatible with the concept of disassembly for purposes of disposal, repair, or recycling, whether the compositions are used as structural components, adhesives, or encapsulants. If, however, the composition itself is designed for disassembly on the molecular scale, it is possible that the many advantages of the cured encapsulant can be retained without the disadvantages of intractability.

As a result, there is a need for encapsulants which provide the requisite curing properties and physical stability once cured which are at the same time reworkable so as to allow for the repair and replacement of discrete devices in the environment of an integrated circuit assembly.

SUMMARY OF THE INVENTION

In accordance with a first aspect of the invention, there is provided an encapsulated circuit assembly comprising a chip; a substrate; at least one solder joint, wherein the solder joint spans between the chip and the substrate forming an electrically conductive connection between the chip and the substrate; and an encapsulant formed adjacent the solder joint, wherein the encapsulant comprises a hyperbranched polymer formed by the reaction of a monomer of the formula: $(A)_n RB$, wherein A is a coupling group reactive with B, B is a coupling group reactive with A, n is greater than 1, and R is a group selected from the group consisting of an aromatic group, an aliphatic group, and mixtures thereof.

In accordance with a further aspect of the invention, there is provided a method of encapsulating a circuit assembly comprising a chip, a substrate, and at least one solder joint spanning between the chip and the substrate, the solder joint forming an electrically conductive connection between the chip and the substrate, the method comprising the steps of: flowing an encapsulant composition into the assembly, adjacent the solder joint; wherein the encapsulant comprises a hyperbranched polymer formed of two or more monomers of the formula: $(A)_n RB$, wherein A is a coupling group reactive with B, B is a coupling group reactive with A, n is greater than 1, and R is a group selected from the group consisting of an aromatic group, an aliphatic group, and mixtures thereof.

DETAILED DESCRIPTION OF THE INVENTION

Figure 1:
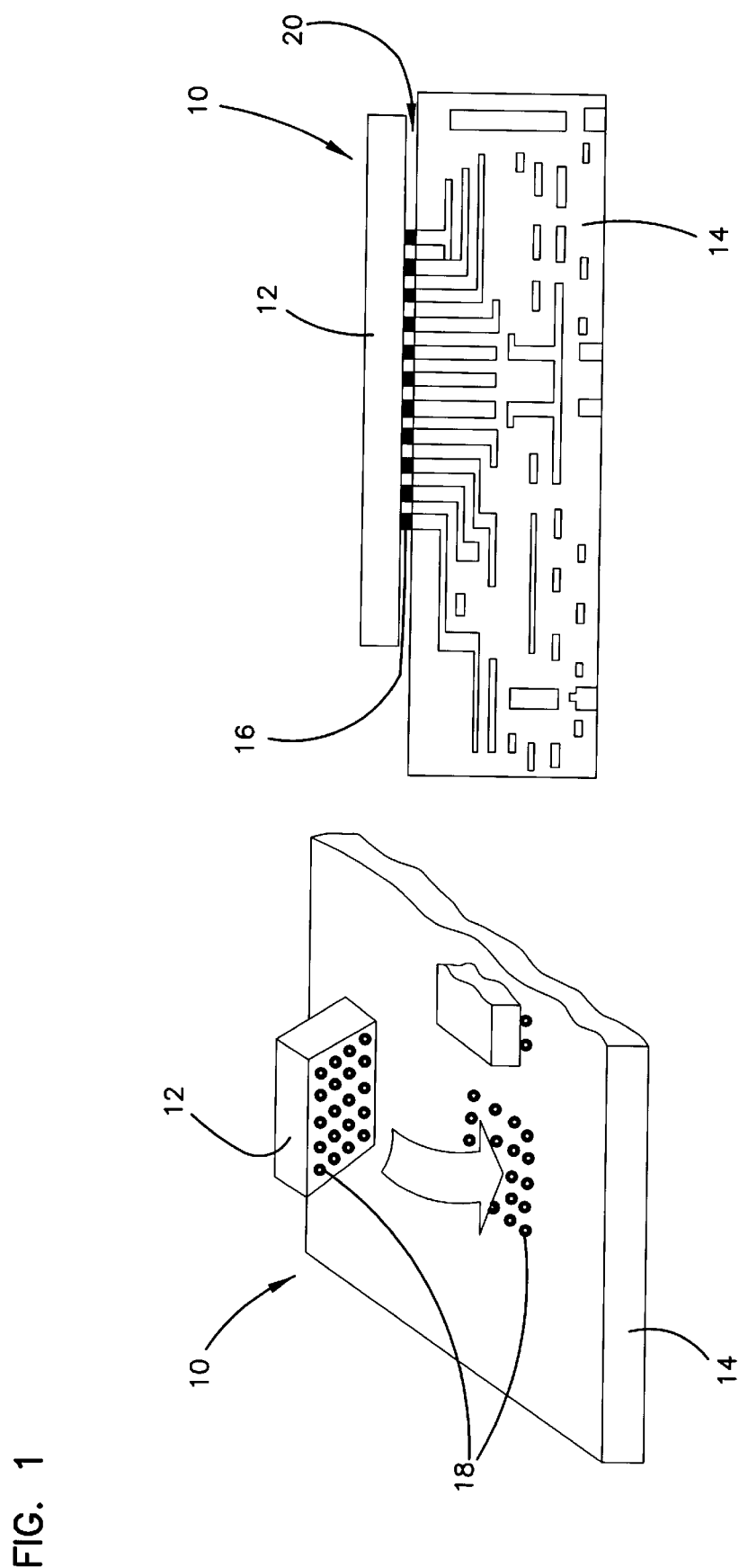
FIG. 1 is a schematic depiction of an exemplary flip-chip assembly process.

The invention is a method of encapsulating discrete semiconductor devices using a thermoplastic composition comprising a hyperbranched polymer. Optionally, the composition may also comprise a filler. The method of the invention includes forming the polymer composition, and applying the polymer to the semiconductor device. Once formed, the encapsulant may be reworked by easily applied parameters.

The Encapsulant

Hyperbranched macromolecules constitute a class of globular materials related to dendrimers. Hyperbranched macromolecules are synthesized from monomers characterized as $A_nRB$ monomers containing n reactive groups of type A and reactive groups of type B. R is a non-reactive organic spacer. These monomers polymerize readily to afford soluble, processable three-dimensional structures free of cross-links.

The overall structure of hyperbranched macromolecules and the one-step synthetic strategy used to prepare them are at the origin of the significant differences between these two families of globular macromolecules. The one-step polymerization of an $A_nB$ monomer is uncontrolled and leads to a complex hyperbranched product containing both linear and dendritic regions.

The reactivity of the two "B" groups, while initially equal, changes as soon as one of the "B" functionalities reacts to form a polymer linkage, "C". This is the result of an increase in steric constraints in the immediate vicinity of the remaining unreacted "B", which, in turn, decreases its reactivity.

Additional electronic factors may further reduce the reactivity of the second "B" group. As a result, three different units are typically found in hyperbranched structures and they differ in the number of B functionalities that have undergone reactions to form the polymeric linkages, "C". Reaction of both B functionalities leads to "dendritic" units that are analogous to the internal building blocks of dendritic macromolecules. Alternatively, if only one of the two B functionalities undergoes reaction, a "linear" unit is obtained and these "failure sequences" constitute the principal structural difference between hyperbranched macromolecules and dendrimers. Finally, if neither of the B functionalities react, a "terminal" unit is obtained which can be considered the equivalent of the outer layer, or chain ends, of a dendritic macromolecule.

For the sake of brevity the representation of numerous complex hyperbranched structures has been simplified using a shorthand version. Therefore, the hyperbranched macromolecule shown as (I) below can also be represented as a tri-bracketed building block (II) in which one of the bonds bears the functional group present at the chain ends. It should be noted that this notation does not imply that a linear structure is obtained.

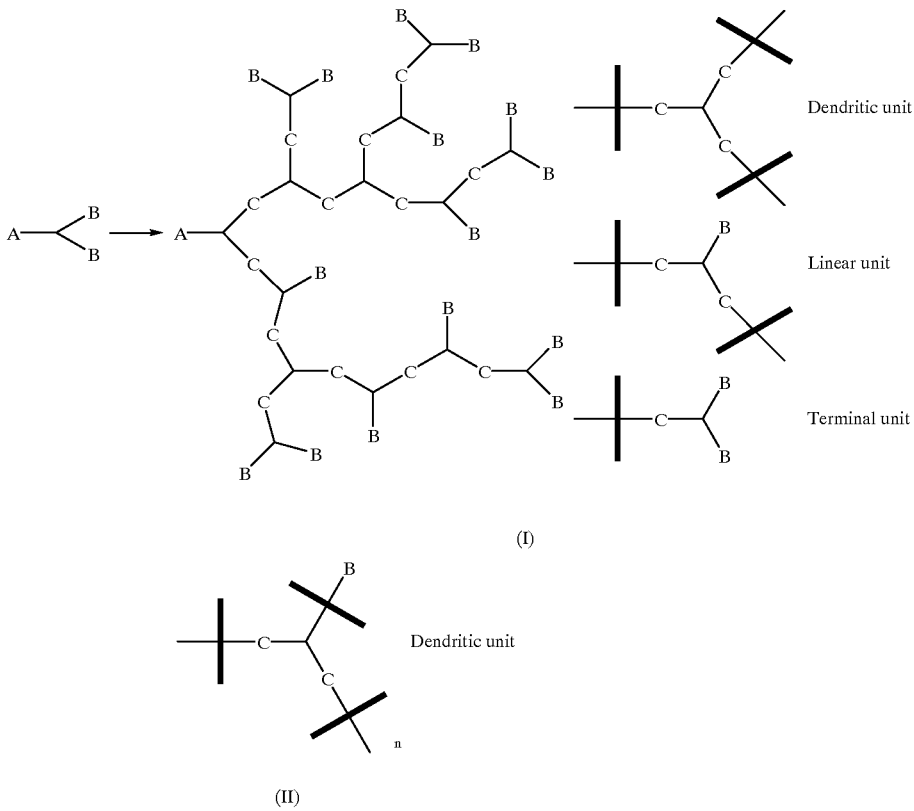

(I)

(II)

Various exemplary monomers used for the preparation of hyper branched polymers can be seen below.

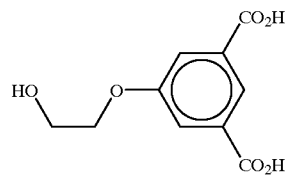

(III)

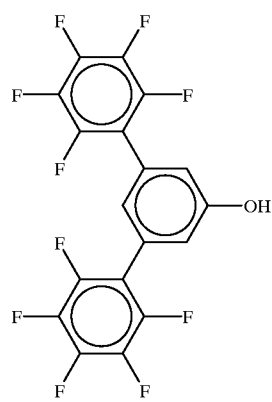

(IV)

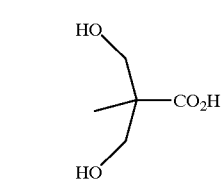

(V)

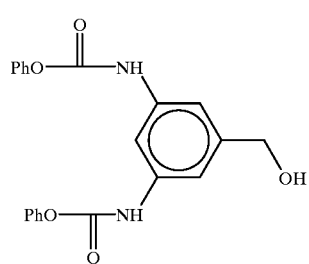

(VI)

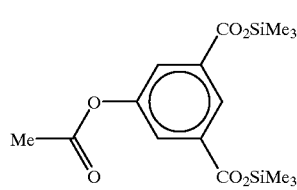

(VII)

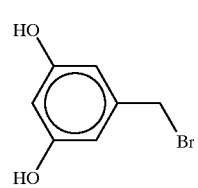

(VIII)

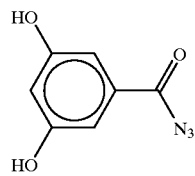

(IX)

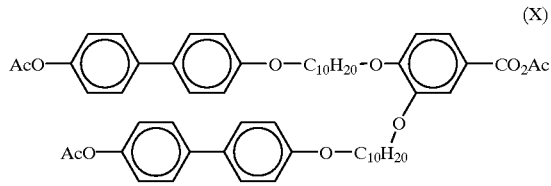

(X)

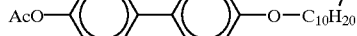

Organic hyperbranched polymers have reactive groups at the chain ends with a substantial number of reactive groups along the outer surface of the macromolecule. Preferably hyperbranched polymers are formed by polycondensation of a multifunctional monomer $(A)_nRB$ wherein A is a coupling group which is reactive with B, R is a nonreactive organic spacer and n>1 preferably about n=2–5 and more preferably about n=2–4.

Suitably, the hyperbranched polymer is polydispersed in both molecular weight and branching. Hyperbranched polymers have low viscosity, high chemical reactivity and enhanced solubility even at higher molecular weights. Preferred hyperbranched polymers for use in the present invention have A and B groups independently selected from F, Cl, Br, CN, —$NH_2$, —$CO_2H$, —$CO_2R^1$, —$C(O)R^2$, OH, and —$NHC(O)R^3$ wherein $R^1$, $R^2$ and $R^3$ are each independently alkyl ($C_{1-6}$ alkyl) or aryl (e.g., phenyl or benzyl) and R is a spacer group selected from alkylene, aryl (e.g., phenyl) or heterocycle. The A and B reactive groups are selected so that they react only with each other. Preferred classes of hyperbranched polymers are hyperbranched poly(aryl ether phenylquinoxalines), poly(etherquinolines), poly(aryl esters), poly(ether ketones), poly(ether sulfones), polyphenylene, polyphenyleneoxide, polycarbonates and poly(etherimides). Suitable hyperbranched polymers for use in the present invention will be known to those skilled in the art such as disclosed in "Comprehensive Polymer Science", 2nd Supplement, Aggarwal, pages 71–132 (1996), the disclosure of which is incorporated herein by reference for all purposes.

Low viscosity systems (both solution and in melt) may be used to readily flow high temperature hyperbranched polymers, and mixtures thereof (i.e., with fillers) under chip. Hyperbranched polymers have thermal stabilities and glass transition temperatures similar to the analogous linear polymers. However, the polymers have low viscosity and higher solubility when compared to linear polymers which allows them to be used as encapsulants, whereas the linear polymers cannot be used.

Preferred monomer structures include:

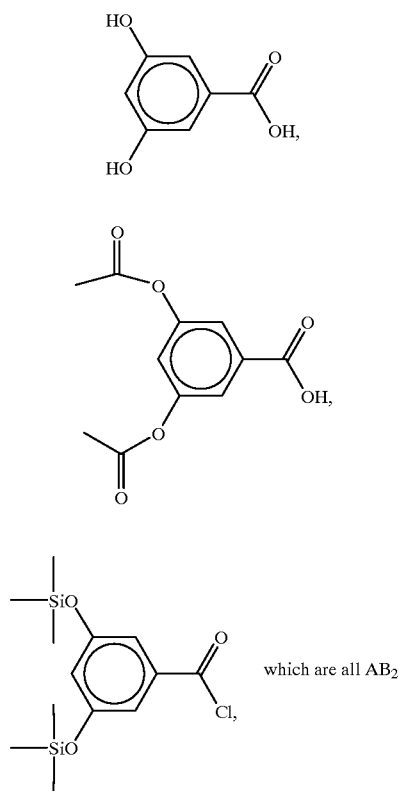

which are all AB$_2$ monomers for the hyperbranched polyesters. The high aromatic content leads to high thermal robustness.

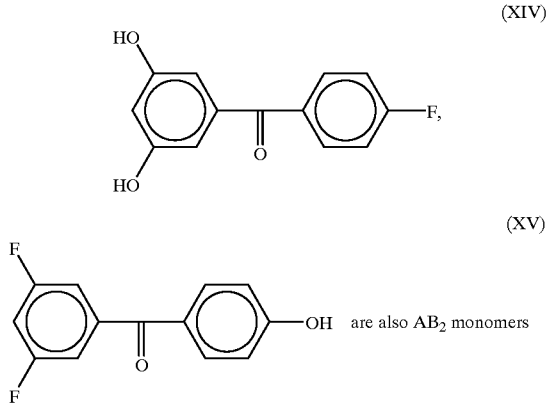

are also AB$_2$ monomers for the hyperbranched poly(etherketones).

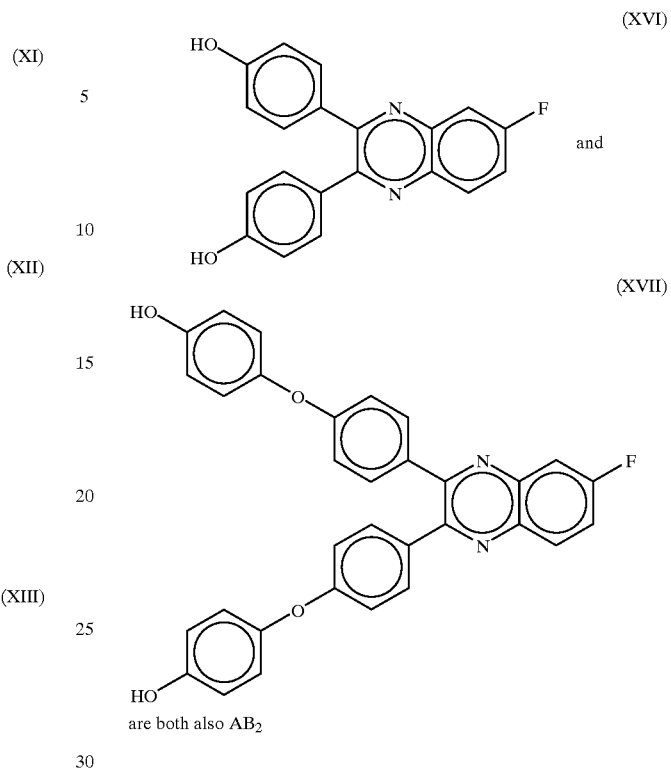

are both also AB$_2$ monomers for the hyperbranched poly(phenylquinoxaline).

Polyester monomers such as (XI) are typically polymerized under bulk conditions under reduced pressures. These monomers can also be polymerized in a high boiling point solvent. In this case, volatiles are removed by distillation for example in diacetate monomers; acetic acid is evolved as polymerization proceeds. Finally, monomers, especially the diphenol can be polymerized with the aid of coupling/dehydration agents, i.e., those typically used for esterification reactions such as for example dicyclohexyl carbodiimide, or N,N-carboxyldimidazole.

Polymerizations are typically run until a molecular weight $M_n$ of about 10,000 to 25,000, and preferably about 15,000 to 20,000 is obtained, Tg suitably should be 200–375° C. and decomposition temperature is greater than 375° C., and preferably greater than 400° C.

Poly(ether ketone) monomers such as XIV are polymerized in high boiling solvents in the presence of a base. Typical solvents are dimethyl formamide (DMF), N-methyl pyrididone (NMP), i.e., dipolar aprotic solvents. Typical bases are potassium carbonate ($K_2CO_3$), potassium hydroxide (KOH), etc. The role of a base is to deprotonate the phenol to give phenoxide which then displaces the activated halide.

Fillers

The composition of the invention may also comprise an inorganic filler.

The suitable filler is easily dispersible (for example, a powder) into the monomer composition. The filler serves to fortify the formulation (i.e., it should not lower the Tg below the glass transition temperature of the monomer homopolymer).

The composition of the invention may also comprise an inorganic filler. Encapsulants may be filled with an inorganic powder to reduce the coefficient of thermal expansion. The optional inorganic filler can be any of the powdered solids known in the art, such as alumina, silica, zinc oxide, talc, etc. For microelectronic applications, the preferred filler is a highly purified form of silica with particle size of 25 microns or less. Generally, the amount of filler may vary but is preferred in the range of 0 to 75 wt %, and preferably in the range of 50–70 wt % of the uncured system.

Application and Recovery

Once polymerized, the polymer composition of the invention may be used to encapsulate any variety or number of semiconductor devices, circuit assemblies, or packaging modules. Representative assemblies include those disclosed in Ehrenberg et al, U.S. Pat. No. 5,199,163 and Harada et al, U.S. Pat. No. 3,801,880 both of which are incorporated herein by reference.

The invention is applicable to typical multichip assemblies such as plastic ball grid arrays, cavity plastic ball grid arrays, and flip chip tape ball grid arrays as well as wire bond ceramic ball grid arrays and flip chip ceramic ball grid arrays. The invention is particularly applicable to flip chip on C4 assemblies. Substrate materials used in these assemblies generally include glasses, ceramics, polyimides, alumina ceramics, thermosetting resins such as epoxies, and mixtures and laminate thereof depending on thermal matching concerns.

As can be seen in FIG. 1, an exemplary flip chip 10 connection is assembled. Flip chip interconnection was implemented to eliminate the expense, unreliability, and inefficiency of manual wire bonding. These connections are generally regarded as controlled-collapse-chip connections (or C4) where the upside down chip 12 is aligned to the substrate 14 and all joints 16 are made simultaneously between chip and substrate contacts 18 by reflowing the solder. Once the connections or joints are formed, a space 20 is generally left between the substrate 14 and the chip 12. The encapsulant (not shown) may then be flowed into this space 20.

The encapsulant may be deposited from a hot melt or a high solids aqueous or organic solution. From the hot melt, the encapsulant may simply be melted adjacent the chip and drawn into the assembly by capillary action. If in solution, the encapsulant also may be drawn into the assembly by capillary action and the solvent evaporated by heating. Appropriate solvents include water, aqueous-organic solvent mixtures, and organic solvents such as PM-acetate, gamma butyrolacatone, cyclohexanone, dimethyl formamide, methyl ethyl ketone, cyclopentamone, N-methyl pyrrolidone, and mixtures thereof. Ideally, the encapsulant of the invention has a solubility of about 50 gm/l to 500 gm/l.

The encapsulant may be reworked merely by focusing heat on the specific device to heat the polymer above the Tg and melt the solder. Normal rework temperatures range from about 200 to 375° C. Encapsulant residue may be removed by washing with an appropriate solvent such as those used for application of the encapsulant.

Working Examples

The following working examples are intended to provide a nonlimiting illustration of the invention.

Poly(aryl ether)s and related polymers comprise a class of materials known as engineering thermoplastics which possess desirable properties including melt and solution processability, high $T_g$ (glass transition temperature), and good mechanical properties. It has been demonstrated that nucleophilic aromatic substitution reactions between activated bishaloaromatic and bisphenol monomers can lead to aryl ether polymers, and commercial examples include polysulfone (UDEL, Amoco) and poly(ether ether ketone) (PEEK, ICI). In these polymerizations the aryl halide is activated toward substitution by an electron-withdrawing group (i.e., sulfone or ketone) which lowers the electron density at the site of substitution and also stabilizes the transition state once substitution has occurred. Certain heterocycles function similarly, and reports of the use of these nonconventional activating groups in polymer-forming reactions have appeared recently.

It is of obvious interest to extend this synthesis of hyperbranched poly(aryl ethers) to heterocycle-activated systems. The quinoxaline heterocycle is particularly well-suited for this application since the appropriately substituted monomers are readily prepared and the quinoaxiline possesses significant activation capability. It has been demonstrated in earlier polymerizations with AA and BB monomer pairs that the 6- and 7-positions of a quinoxaline heterocycle as well as the para positions of both the 2-phenyl and 3-phenyl groups of 2,3-diphenylquinoxaline are activated. Furthermore, the quinoxaline-activated polyether synthesis has been extended to the self-polymerization of an AB monomer. High molecular weight linear poly(aryl ether phenylquinoxaline)s have been prepared by each synthetic pathway by the polymerization of appropriately substituted aryl fluorides containing preformed quinoxaline heterocycles with a variety of bisphenols. The $A_2B$ quinoxaline monomer synthesis involves condensation of a bisphenol-substituted benzil and a fluoro-substituted o-phenylenediamine (Scheme 1). The requisite bisphenolic benzil is itself easily prepared by aromatic nucleophilic substitution on 4,4'-difluorobenzil. For this study, $A_2B$ monomers (1 and 2) containing a single aryl fluoride and two phenolic hydroxyl groups were prepared and polymerized to give hyperbranched quinoxaline containing poly(aryl ether)s.

Scheme 1
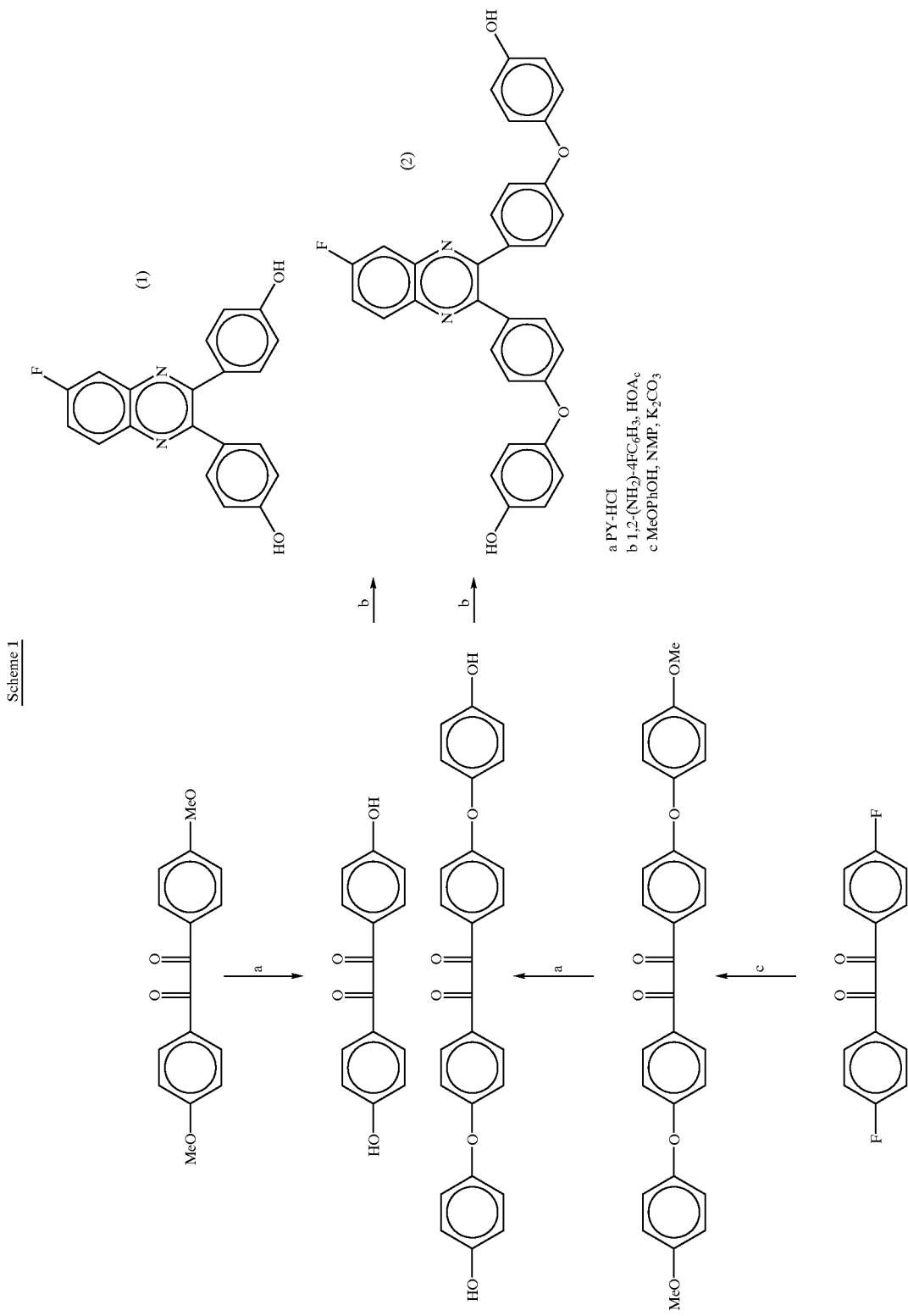

The self-polymerization of the quinoxaline $A_2B$ monomers (1 and 2) was carried out in N-methylpyrrolidinone (NMP) containing potassium carbonate (Scheme 2). The potassium carbonate was used to convert the bisphenol into the more reactive bisphenoxide, and since potassium carbonate is a relatively weak and non-nucleophilic base, no hydrolytic side reactions were observed. As for the case of almost all poly(aryl ether) syntheses, dipolar aprotic solvents were used since they effectively solvate the monomers, polar intermediates, and, in most cases, the subsequent polymer. For this investigation, we examined several solvent systems: NMP, NMP/CHP (N-cyclohexyl-2-pyrrolidone) (50/50) mixture, and DMPU (N,N'-dimethylpropyleneurea). Although NMP tends to be a better solvent and easier to

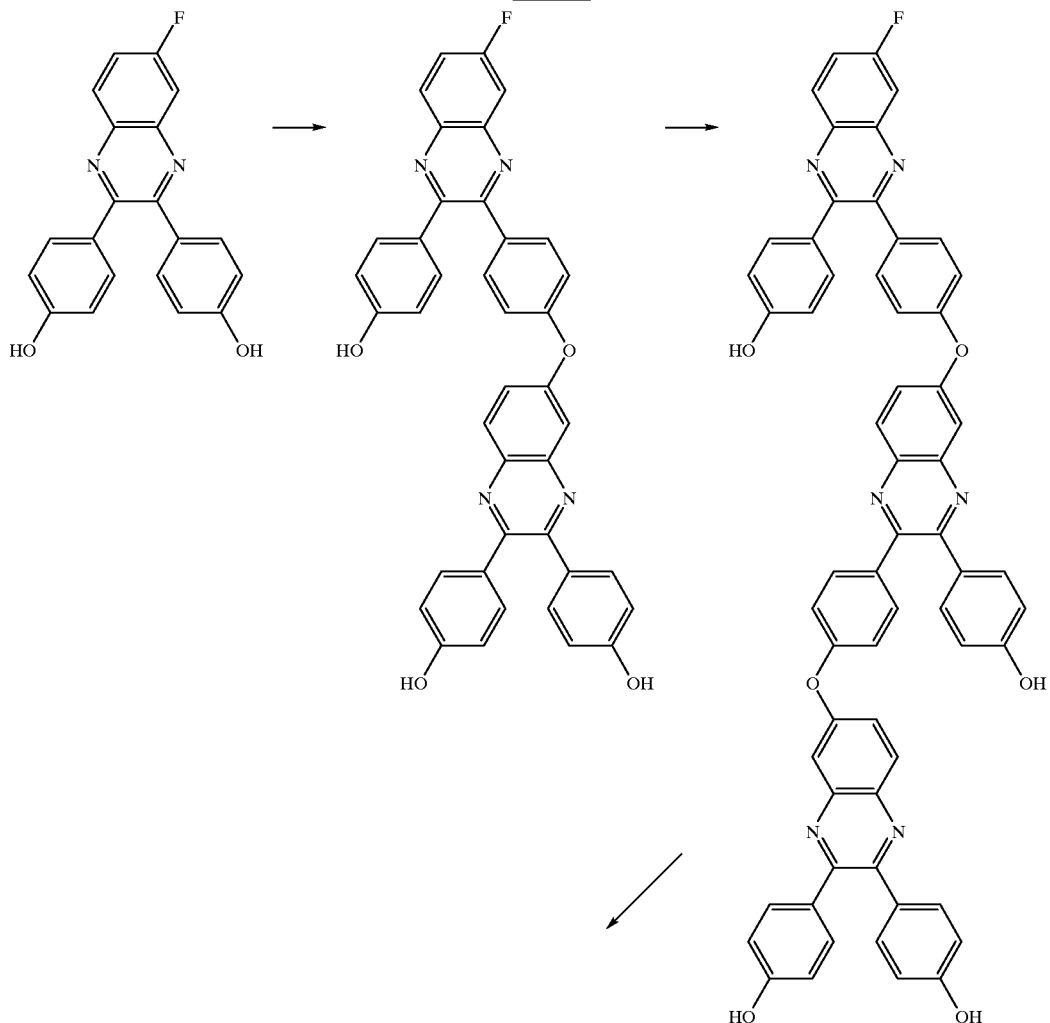

Scheme 2

-continued
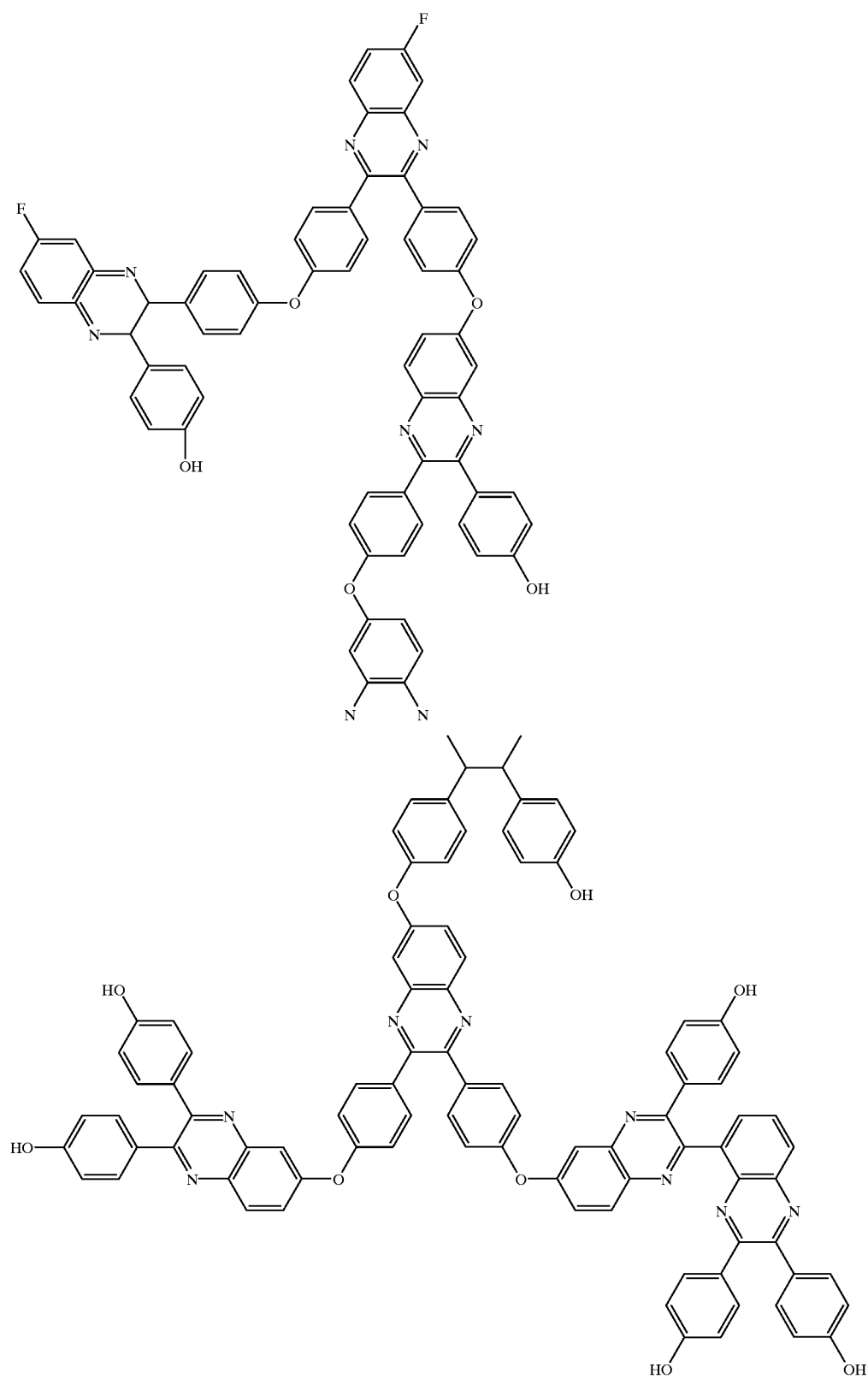
handle, NMP/CHP solvent mixtures are often used since CHP is not miscible with water at temperature above 100° C. On the other hand, DMPU has been shown to be an excellent solvent for polyether syntheses and, in particular, for those polymers which are only marginally soluble in other aprotic dipolar solvents. Furthermore, DMPU allows high reaction temperatures (260° C.). As in the case for most poly(aryl ether) syntheses, the solid compositions were maintained at 20% to avoid side reactions with fluoride ion. Irrespective of the polymerization solvent(s), toluene was used during the initial stages of the polymerizations to remove water generated by bisphenoxide formation. This solvent mixture gave a reflux temperature between 150 and 165° C. In an effort to maintain a dry system, the toluene was periodically removed through the Dean-Stark trap and replaced with deoxygenated dry toluene. Upon completion of bisphenoxide formation and dehydration, the polymerization mixtures were heated to 180–220° C. to effect the displacement reaction. In each case, high molecular weight polymer was attained within 48 h as judged by the dramatic increase in viscosity. The polymers were isolated by precipitation into a 10-fold excess of methanol and boiled in water to remove the remaining salts.

processing in the microelectronics industry. The resulting polymer was capable of film formation; however, the film was somewhat brittle. The polymer formed from polymerization of monomer 2 in NMP/CHP appeared to have limited solubility for the desired solids composition at 190° C., whereas polymerization in DMPU proceeded readily to afford polymer 4. There is a considerable difference in the molecular weight of the polymers, as judged by intrinsic viscosity measurements, as a result of the polymerization being performed in different solvents, and this presumably results from the improved polymer solubility in DMPU.

Chart 1

| Polymer Entry | [η] NMP 25° C. dL/g | Tg, °C. |
|---|---|---|
| (structure 1) | 0.47 | 190 |
| (structure 2) | 0.55 | 255 |

This general procedure was applied to each of the $A_2B$ monomers (1 and 2), yielding polymers 3 and 4, respectively. It appears that moderately high molecular weight polymer was achieved in each case as indicated by the intrinsic viscosity measurements (Chart 1). Monomer 1 was polymerized in a NMP/CHP solvent mixture or in NMP containing potassium carbonate. The polymer remained soluble throughout the polymerization, affording moderately high viscosity. The $T_g$ of the resulting branched poly(aryl ether phenylquinoxaline) was comparable to those of its linear analogues (190° C.). In contrast to many heterocycle-containing polymers, poly(aryl ether phenylquinoxaline) was soluble in NMP, a solvent commonly used for polymer The above specification, examples and data provide a complete description of the manufacture and use of the composition of the invention. Since many embodiments of the invention can be made without departing from the spirit and scope of the invention, the invention resides in the claims hereinafter appended.

The claimed invention is:

1. An encapsulated circuit assembly comprising:
    (a) a chip
    (b) a substrate;
    (c) at least one solder joint, wherein said solder joint spans between said chip and said substrate forming an electrically conductive connection between said chip and said substrate; and (d) a reworkable encapsulant formed adjacent said solder joint, wherein said reworkable encapsulant comprises a hyperbranched polymer formed by the reaction of a monomer of the formula:

(A)$_n$RB wherein A is a coupling group reactive with B, B is a coupling group reactive with A, n is greater than 1, and R is a group selected from the group consisting of an aromatic group, an aliphatic group, and mixture thereof.

2. The assembly of claim 1, wherein said substrate comprises a material selected from the group consisting of a glass, a ceramic, a polyimide, a thermosetting resin, and mixtures thereof.

3. The assembly of claim 1, wherein said assembly comprises a flip chip.

4. The assembly of claim 1, wherein said assembly is selected from the group consisting of a plastic ball grid array, a cavity plastic ball grid array, a tape ball grid array, a wire bond ceramic ball grid array, and a flip chip ceramic ball grid array.

5. The assembly of claim 1, wherein n ranges from about 2 to 5.

6. The assembly of claim 1, wherein A is a group selected from the group consisting of F, Cl, Br, CN, —NH$_2$, —CO$_2$H, —CO$_2$R$^1$, —C(O)R$^2$, —OH, —NHC(O)R$^3$ and mixtures thereof, and wherein R$^1$, R$^2$, and R$^3$ are each independently selected from the group consisting of a C$_{1-6}$ alkyl, a phenyl, a benzyl, and mixture thereof.

7. The assembly of claim 1, wherein B is a compound selected from the group consisting of F, Cl, Br, CN, —NH$_2$, —CO$_2$H, —CO$_2$R$^1$, —C(O)R$^2$, —OH, —NHC(O)R$^3$, and mixtures thereof and wherein each R$^1$, R$^2$, and R$^3$ are each independently selected from the group consisting of a C$_{1-6}$ alkyl, a phenyl, a benzyl and mixtures thereof.

8. The assembly of claim 1, wherein said polymer has a molecular weight ranging from about 2,000 to 50,000 M$_n$.

9. The assembly of claim 1, wherein said polymer has a T$_g$ of less than about 400° C.

10. The assembly of claim 1, wherein said polymer is selected from the group consisting of poly(aryl ether phenylquinoxalines), poly(etherquinolines), poly(aryl esters), poly(ether ketones), poly(ether sulfones), polyphenylene, polyphenyleneoxide, polycarbonates and poly(etherimides) and mixtures thereof.

11. The assembly of claim 1, wherein said reworkable encapsulant further includes a filler.

12. The assembly of claim 11, wherein said filler is an inorganic filler.

13. The assembly of claim 12, wherein said inorganic filler is a powdered solid selected from the group consisting of alumina, silica, zinc oxide and talc.

* * * * *